(12) United States Patent
Kumar

(10) Patent No.: US 11,907,885 B1
(45) Date of Patent: Feb. 20, 2024

(54) SYSTEM AND METHOD FOR COMPUTATIONAL SIMULATION AND AUGMENTED/VIRTUAL REALITY IN A CONSTRUCTION ENVIRONMENT

(71) Applicant: Slate Technologies Inc., Pleasanton, CA (US)

(72) Inventor: Senthil Manickavasgam Kumar, Dublin, CA (US)

(73) Assignee: Slate Technologies Inc., Pleasanton, CA (US)

( * ) Notice: Subject to any disclaimer, the term of this patent is extended or adjusted under 35 U.S.C. 154(b) by 0 days.

(21) Appl. No.: 17/894,418

(22) Filed: Aug. 24, 2022

Related U.S. Application Data

(60) Provisional application No. 63/324,715, filed on Mar. 29, 2022.

(51) Int. Cl.
| | | |
|---|---|---|
| *G06Q 10/10* | (2023.01) | |
| *G06Q 10/06* | (2023.01) | |
| *G06Q 30/02* | (2023.01) | |
| *G06Q 30/06* | (2023.01) | |
| *G06Q 10/067* | (2023.01) | |
| *G06N 20/20* | (2019.01) | |
| *G06Q 10/0631* | (2023.01) | |

(52) U.S. Cl.
CPC ........... *G06Q 10/067* (2013.01); *G06N 20/20* (2019.01); *G06Q 10/06315* (2013.01)

(58) Field of Classification Search
CPC . G06Q 10/067; G06Q 10/06315; G06N 20/20
USPC .................................. 705/1.1–912
See application file for complete search history.

(56) References Cited

U.S. PATENT DOCUMENTS

| | | |
|---|---|---|
| 2,052,346 A | 8/1936 | Garrett |
| 7,113,915 B1 | 9/2006 | Montemayor |
| 7,283,975 B2 | 10/2007 | Broughton |
| 8,204,619 B2 | 6/2012 | Heil |

(Continued)

FOREIGN PATENT DOCUMENTS

WO    WO-2022026520 A1 *    2/2022

OTHER PUBLICATIONS

Jun Yang et al., Construction Performance Monitoring Via Still Images, Time-Lapse Photos and Video Streams; Now, Tomorrow, and The Future, Advance Engineering Informatics, vol. 29, Issue 2, 2015, pp. 211-224, ISSN 1474-0346. (Year 2015).

(Continued)

*Primary Examiner* — Jonathan P Ouellette
(74) *Attorney, Agent, or Firm* — Haverstock & Owens, A Law Corporation

(57) ABSTRACT

A method for simulating a scenario in a computing environment is described. The method includes determining a user intent of a user from an input received from the user for executing at least one intended task by the user, generating a feature set based on analyzing the user intent, and processing, based on the user intent, at least one data feed received from a database to select at least one plan of action for executing the at least one intended task. At least one plan of action is simulated in a graphical user interface as virtual or augmented reality based on the feature set to enable at least one of responding additionally received input from the user and the at least one intended task is performed according to the user intent.

16 Claims, 4 Drawing Sheets

(56) References Cited

U.S. PATENT DOCUMENTS

| | | | |
|---|---|---|---|
| 8,260,648 B2 | 9/2012 | Elazouni et al. | |
| 8,775,229 B1 | 7/2014 | Danskin | |
| 9,070,216 B2 | 6/2015 | Golparvar-Fard et al. | |
| 9,189,571 B2 | 11/2015 | Loberg | |
| 9,507,885 B2 | 11/2016 | Yu et al. | |
| 9,996,810 B2 | 6/2018 | Augenstein et al. | |
| 10,311,529 B1* | 6/2019 | Noel | G06Q 30/0611 |
| 10,452,790 B2 | 10/2019 | Kim et al. | |
| 10,460,173 B2* | 10/2019 | Sasson | G06V 10/10 |
| 10,572,848 B2 | 2/2020 | Sen | |
| 10,713,607 B2 | 7/2020 | Pettersson et al. | |
| 10,846,640 B2 | 11/2020 | Goel et al. | |
| 10,970,796 B2* | 4/2021 | Sasson | G06V 20/20 |
| 11,017,335 B1 | 5/2021 | Ponce de Leon | |
| 11,100,663 B2 | 8/2021 | Nemoto et al. | |
| 11,176,495 B1 | 11/2021 | Ron et al. | |
| 11,208,807 B1 | 12/2021 | Lopes | |
| 11,263,371 B2 | 3/2022 | Bowen et al. | |
| 11,263,557 B2 | 3/2022 | Yellin | |
| 11,381,726 B2 | 7/2022 | Zass | |
| 11,416,958 B1 | 8/2022 | Reichert et al. | |
| 11,481,853 B2* | 10/2022 | Bellaish | G06F 18/2113 |
| 11,531,943 B1 | 12/2022 | Kumar | |
| 2002/0156668 A1 | 10/2002 | Morrow et al. | |
| 2003/0018507 A1 | 1/2003 | Flanagan | |
| 2003/0200062 A1 | 10/2003 | Dessureault et al. | |
| 2004/0236547 A1 | 11/2004 | Rappaport et al. | |
| 2006/0059838 A1 | 3/2006 | Pimental | |
| 2006/0075718 A1 | 4/2006 | Borne et al. | |
| 2006/0190391 A1 | 8/2006 | Cullen, III et al. | |
| 2006/0228962 A1 | 10/2006 | Souther et al. | |
| 2007/0245300 A1 | 10/2007 | Chan et al. | |
| 2007/0265724 A1 | 11/2007 | Mifsud et al. | |
| 2007/0271073 A1 | 11/2007 | Mifsud et al. | |
| 2008/0005079 A1 | 1/2008 | Flake et al. | |
| 2008/0015823 A1 | 1/2008 | Arnold et al. | |
| 2008/0040264 A1 | 2/2008 | Allin et al. | |
| 2008/0077364 A1 | 3/2008 | Wakelam et al. | |
| 2008/0109330 A1 | 5/2008 | Torres | |
| 2008/0313110 A1 | 12/2008 | Kreamer | |
| 2010/0010883 A1 | 1/2010 | Neilsen et al. | |
| 2010/0153280 A1 | 6/2010 | Fox et al. | |
| 2010/0235206 A1 | 9/2010 | Miller et al. | |
| 2011/0181589 A1* | 7/2011 | Quan | G06T 17/05 345/420 |
| 2012/0066019 A1 | 3/2012 | Hinshaw et al. | |
| 2012/0131878 A1 | 5/2012 | Ivanov | |
| 2012/0166177 A1 | 6/2012 | Beld et al. | |
| 2013/0155058 A1* | 6/2013 | Golparvar-Fard | G06Q 10/06311 345/419 |
| 2014/0122143 A1 | 5/2014 | Fletcher | |
| 2015/0193561 A1 | 7/2015 | Lindberg et al. | |
| 2015/0310135 A1 | 10/2015 | Forsyth et al. | |
| 2016/0292306 A1 | 10/2016 | Migneault et al. | |
| 2016/0378861 A1* | 12/2016 | Eledath | G06V 20/52 707/766 |
| 2017/0337261 A1 | 11/2017 | Wang | |
| 2018/0276319 A1 | 9/2018 | Tierney et al. | |
| 2019/0012605 A1 | 1/2019 | Rajagopal et al. | |
| 2019/0138667 A1 | 5/2019 | Benesh et al. | |
| 2019/0200169 A1 | 6/2019 | Bapna et al. | |
| 2019/0286985 A1 | 9/2019 | Hirvijarri | |
| 2019/0294673 A1* | 9/2019 | Sapugay | G06F 40/295 |
| 2019/0303512 A1 | 10/2019 | Davies et al. | |
| 2019/0317805 A1 | 10/2019 | Metsch et al. | |
| 2020/0042915 A1* | 2/2020 | Samson | G06Q 50/08 |
| 2020/0057811 A1* | 2/2020 | Seegan | G06F 40/30 |
| 2020/0412926 A1 | 12/2020 | Zass et al. | |
| 2020/0413011 A1* | 12/2020 | Zass | G06Q 30/0185 |
| 2021/0073694 A1 | 3/2021 | Yellin et al. | |
| 2021/0081819 A1* | 3/2021 | Polleri | H04L 51/02 |
| 2021/0081859 A1 | 3/2021 | Goel | |
| 2021/0120206 A1 | 4/2021 | Liu et al. | |
| 2021/0125124 A1 | 4/2021 | Meharwade et al. | |
| 2021/0192099 A1* | 6/2021 | Benromano | G06Q 10/06 |
| 2021/0287177 A1 | 9/2021 | Musialek et al. | |
| 2021/0316457 A1 | 10/2021 | Kang et al. | |
| 2021/0316459 A1 | 10/2021 | Kang et al. | |
| 2021/0350310 A1 | 11/2021 | Tashkin | |
| 2021/0383033 A1 | 12/2021 | Glenn et al. | |
| 2022/0066456 A1 | 3/2022 | Ebrahimi Afrouzi et al. | |
| 2022/0084140 A1 | 3/2022 | Daczko et al. | |
| 2022/0130145 A1* | 4/2022 | Connary | G06V 20/10 |
| 2022/0215135 A1 | 7/2022 | Shortridge | |
| 2022/0245353 A1* | 8/2022 | Turkkan | G06F 40/216 |
| 2022/0284366 A1 | 9/2022 | Kelly et al. | |
| 2022/0318936 A1* | 10/2022 | Copley | G06F 30/13 |
| 2022/0343155 A1 | 10/2022 | Mitra | |
| 2022/0358259 A1 | 11/2022 | Manish et al. | |
| 2022/0405436 A1 | 12/2022 | Jung et al. | |
| 2023/0185978 A1 | 6/2023 | Danon et al. | |
| 2023/0251631 A1 | 8/2023 | Pederson et al. | |

OTHER PUBLICATIONS

Venkatasubramanian, Karthik, "Using AI and Machine Learning to Predict Construction Schedule Delays", Oracle Construction and Engineering Blog, Jul. 1, 2021, pp. 1-5.

Fitzsimmons, John et al., "Improving Construction Project Schedules Before Execution", 37th International Symposium on Automation and Robotics in Construction (ISARC 2020), pp. 1-8.

International Searching Authority, "International Search Report" and "Written Opinion" in application No. PCT/US2023/015098, dated Apr. 17, 2023, 7 pages.

Yang et al. ("Adopting Building Information Modeling (BMI) for the Development of Smart Buildings: A Review of Enabling Applications and Challenges", Hindawi Advances in Civil Engineering, 2010, 99 1-26) (Year: 2010).

Valdes et al. ("Applying Systems Modeling Approaches to Building Construction", ISARC 2016, pp. 1-9) (Year 2016).

Bortolini et al. ("Site logistics planning and control for engineer-to-order prefabricated building systems using BIM 4D modelling", Automation in Construction 98 (2019) 248-264) (Year 2019).

International Searching Authority, "International Search Report" and "Written Opinion" in application No. PCT/US2023/016515, dated Jun. 22, 2023, 8 pages.

International Searching Authority, "International Search Report" and "Written Opinion" in application No. PCT/US2023/016521, dated Jul. 12, 2023, 18 pages.

\* cited by examiner

SYSTEM AND METHOD FOR COMPUTATIONAL SIMULATION AND AUGMENTED/VIRTUAL REALITY IN A CONSTRUCTION ENVIRONMENT

RELATED APPLICATION(S)

This application claims priority under 35 U.S.C. § 119(e) of the U.S. Provisional Patent Application having Ser. No. 63/324,715, filed Mar. 29, 2022, and titled "System and methods for intent-based factorization and computational simulation," entire contents of which are hereby incorporated by reference for all purposes as if fully set forth herein.

This application is related to U.S. Provisional Application No. 63/280,881, filed Nov. 18, 2021, and titled "Method and System for Multi-Factor Optimization of Schedules and Resource Recommendations for Smart Construction Utilizing Human and Machine Cognition," and U.S. patent application Ser. No. 17/683,858, filed Mar. 1, 2022, and titled "Intelligence Driven Method and System for Multi-Factor optimization of Schedules and Resource Recommendations for Smart Construction," the entire contents of which are hereby incorporated by reference for all purposes as if fully set forth herein.

TECHNICAL FIELD

One technical field of the present disclosure is generally related to artificial intelligence (AI) and machine learning (ML) in a construction environment. The disclosure relates, in particular, to implementation and use of ML, AI, cognition, self-learning, and trainable systems for intent-based factorization and computational simulation for optimal construction design in an Architecture, Engineering, and Construction (AEC) environment. The disclosure also relates to optimizing a construction process all the way from pre-construction planning and strategic endeavors to during construction tactical tasks, and predictive and proactive planning, and analysis to post-construction operational efficiencies.

BACKGROUND

The approaches described in this section are approaches that could be pursued, but not necessarily approaches that have been previously conceived or pursued. Therefore, unless otherwise indicated, it should not be assumed that any of the approaches described in this section qualify as prior art merely by virtue of their inclusion in this section.

AEC software may be used for every step or stage of a construction project, from planning to designing to actual construction. A final output of the AEC software may be simulated logistics of the project and represented through a spreadsheet or a diagrammatic representation. By using the AEC software and accessing such final output, users can understand the relationships between buildings, building materials, and other systems in a variety of situations and attempt to account for them in their decision-making processes.

However, conventional AEC software solutions are isolated frameworks and restricted to accepting inputs of certain types such as a standard rigid questionnaire. Accordingly, when confronted with a multitude and diverse input, conventional AEC software solutions are unable to adapt or make decisions in real-time or near real-time to account for the dynamic nature of a construction project. In an example, parsing of a user query provided as a natural language input so as to drive the output of the AEC software requires an interfacing of the AEC software with state-of-the-art parsers such as language processors, thereby incurring time and expenditure to interface an external media with the AEC software. The same rationale applies when it comes to attempting to drive the output of the AEC software based on a user intent, which may not be an explicit but an implicit input.

As discussed above, conventional systems in the AEC field rely on manual and rule-based approaches (such as accepting only certain user inputs) for generating specific scenario-based outcomes. In an example, any natural language (NL) input provided by a user may not customize the output as intended and end up being ignored. Accordingly, these conventional systems fail to comprehend dynamic variations in factors impacting construction and may fail to provide any meaningful insights or actionable guidance to improve the construction design.

These problems are exacerbated in the AEC field as factors that impact the construction schedule and design are many and varied. Some of these factors are near impractical to predict, plan, and accommodate until the factors come to pass or are likely to come to pass with some degree of certainty.

Accordingly, there is a need for technical solutions that address the needs described above, as well as other inefficiencies of the state of the art.

SUMMARY

The following represents a summary of some embodiments of the present disclosure to provide a basic understanding of various aspects of the present disclosure. This summary is not an extensive overview of the present disclosure. It is not intended to identify key or critical elements of the present disclosure or to delineate the scope of the present disclosure. Its sole purpose is to present some embodiments of the present disclosure in a simplified form as a prelude to the more detailed description that is presented below.

Embodiments of an AI-based system and a corresponding method are disclosed that address at least some of the above-described challenges and issues.

In an aspect, a method for simulating a scenario in a computing environment is provided. The method includes determining a user intent of a user from an input received from the user for executing at least one intended task by the user, generating a feature set based on analyzing the user intent, and processing, based on the user intent, at least one data feed received from a database to select at least one plan of action for executing the at least one intended task. At least one plan of action is simulated in a graphical user interface as virtual or augmented reality based on the feature set to enable at least one of responding an additionally received input from the user and performing the at least one intended task according to the user intent. Steps of the method may be continuously repeated during a simulation session.

In another aspect, a method to execute one or more actions in a virtual environment is provided. The method includes receiving a user input related to a construction project. The method further includes determining a user intent from the received user input. The method furthermore includes processing one or more real-time data feeds based on the user intent. The method additionally includes executing one or more actions in the virtual environment representing the construction project based on the processed one or more real-time data feeds.

In an embodiment, the input is received from the user as at least one of a text, an image, a video, and an audio format. At least one intended task is determined from the user input based on subjecting the user input to at least one of a natural language processing technique, an audio processing technique, and an image processing technique. In an embodiment, the user intent corresponds to a plurality of preferences of the user pertaining to execution of the at least one intended task, and the user intent is classifiable as at least one of a temporal intent, a spatial intent, a fiscal intent, and a societal intent. The feature set corresponds to a multi-dimensional design vector including at least one of a position coordinate system, cost, sustainability, safety, facility management, a construction principle, and an industry standard.

In an embodiment, processing the at least one data feed comprises processing one or more data feeds by an ensemble learning unit based on the user intent. The ensemble learning unit may be one or more modules, each of the modules including an ensemble of one or more machine learning models. In an embodiment, in case of the user intent being a temporal intent to expedite an ongoing construction process in real-world (actual construction process), the processing of the at least one data feed comprises processing a data feed related to real-time cost of a plurality of raw material suppliers, evaluating each of the plurality of raw material suppliers, and selecting relevant suppliers out of the plurality of raw material suppliers based on the evaluation. In an embodiment, the method further includes providing recommendations of a plurality of activities to be implemented according to the user intent for performance of the at least one intended task.

In an embodiment, the simulation further includes simulation of the at least one plan of action for the at least one intended task in accordance with at least one objective related to the at least one intended task, and the at least one objective is determined from the user input based on a natural language parser and a work tokenizer. The simulation of the at least one plan of action further includes simulation of a plurality of construction requirements of a project as augmented reality. The augmented reality comprises an actual image of a site augmented by at least one content item representing the plurality of construction requirements associated with at least one portion of the actual image. The simulation is rendered on a graphical user interface.

In another aspect, a non-transitory computer-readable storage medium is provided. The non-transitory computer-readable storage medium, having stored thereon a computer-executable program which, when executed by at least one processor, causes the at least one processor to determine a user intent of a user from an input received from the user for executing at least one intended task by the user, generate a feature set based on analyzing the user intent, process at least one data feed received from a database based on the user intent to select at least one plan of action for executing the at least one intended task, and simulate in a graphical user interface the at least one plan of action as virtual or augmented reality based on the feature set to enable at least one of responding an additionally received input from the user, and perform the at least one intended task according to the user intent.

BRIEF DESCRIPTION OF THE DRAWINGS

Further advantages of the disclosure will become apparent by reference to the detailed description of preferred embodiments when considered in conjunction with the drawings. In the drawings, identical numbers refer to the same or a similar element.

DETAILED DESCRIPTION

Figure 1:
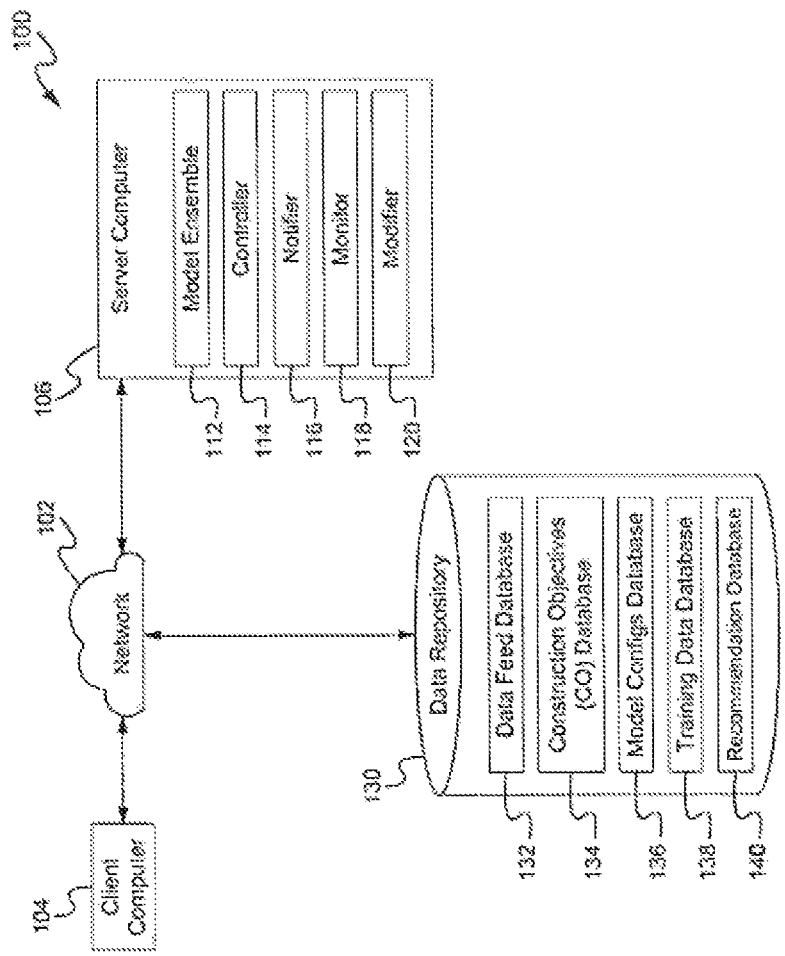
FIG. 1 illustrates an example networked computer system, in accordance with the embodiments presented herein.

The following detailed description is presented to enable a person skilled in the art to make and use the disclosure. For purposes of explanation, specific details are set forth to provide a thorough understanding of the present disclosure. However, it will be apparent to one skilled in the art that these specific details are not required to practice the disclosure. Descriptions of specific applications are provided only as representative examples. Various modifications to the preferred embodiments will be readily apparent to one skilled in the art, and the general principles defined herein may be applied to other embodiments and applications without departing from the scope of the disclosure. The present disclosure is not intended to be limited to the embodiments shown but is to be accorded the widest possible scope consistent with the principles and features disclosed herein.

Embodiments are described herein in sections according to the following outline:

1.0 GENERAL OVERVIEW
2.0 STRUCTURAL OVERVIEW
3.0 FUNCTIONAL OVERVIEW
   3.1 MODEL ENSEMBLE
   3.2 CONTROLLER
   3.3 NOTIFIER
   3.4 MONITOR
   3.5 MODIFIER
4.0 PROCEDURAL OVERVIEW
5.0 EXAMPLE INTENT-BASED FACTORIZATION AND COMPUTATIONAL SIMULATION FLOW
6.0 OTHER ASPECTS OF DISCLOSURE 1.0 GENERAL OVERVIEW

Appropriating an AEC environment for planning any construction related activity usually involves multiple processes and implementations including generation and management of diagrammatic and digital representations of a part or whole of construction designs, associated works, and several algorithms-driven planning and management of human, equipment, and material resources associated with undertaking the construction in a real-world environment. The process involves the creation of digital twins (e.g., a virtual representation) of a construction model, and simulation of various processes and events of a construction project. For example, these aspects may include a construction schedule, work packs, work orders, sequence and timing of materials needed, procurement schedule, timing and source for procurement, etc. Additional aspects including labor, duration, dependence on ecosystem factors, topology of the construction area, weather patterns, and surrounding traffic are also considered during aforesaid creation of the virtual representation. Furthermore, cost parameters, timelines, understanding and adherence to regulatory processes, and environmental factors, also play an important role in AEC planning.

Techniques described herein are directed to a system for simulating a scenario in a computing environment. The system comprises a controller configured to determine a user intent of a user from an input received from the user for executing at least one intended task by the user and generate a feature set based on analyzing the user intent. The system further comprises a model ensemble configured to process, based on the user intent, at least one data feed received from a database to select at least one plan of action for executing the at least one intended task. Furthermore, the system comprises a notifier configured to simulate in a graphical user interface the at least one plan of action as virtual or augmented reality based on the feature set to enable at least one of responding an additionally received input from the user, and performing the at least one intended task according to the user intent.

In an embodiment, the input is received from the user as at least one of a text, an image, a video, and an audio format. The at least one intended task is determined from the user input based on subjecting the user input to at least one a natural language process technique, an audio process technique, and an image processing technique. The user intent corresponds to a plurality of preferences of the user pertaining to execution of the at least one intended task. In an embodiment, the user intent is classifiable as at least one of a temporal intent, a spatial intent, a fiscal intent, and a societal intent. In an embodiment, the feature set corresponds to a multi-dimensional design vector comprising at least one of a position coordinate system, cost, sustainability, safety, facility management, a construction principle, and an industry standard.

In an embodiment, the model ensemble for processing the at least one data feed is configured to process one or more data feeds by an ensemble learning unit based on the user intent. In an embodiment, the controller is further configured to provide recommendations of a plurality of activities to be implemented according to the user intent for performance of the at least one intended task. In an embodiment, the notifier is further configured to simulate the at least one plan of action for the at least one intended task in accordance with at least one objective related to the at least one intended task, wherein the at least one objective is determined from the user input based on a natural language parser and a work tokenizer. The notifier configured to simulate the at least one plan of action is further configured to simulate a plurality of construction requirements of a project as augmented reality. The augmented reality comprises an actual image of a site augmented by at least one content item representing the plurality of construction requirements associated with at least one portion of the actual image.

Various embodiments of the methods and systems are described in more detail with reference to FIGS. 1-3. Other embodiments, aspects, and features will become apparent from the remainder of the disclosure as a whole.

Certain terms and phrases have been used throughout the present disclosure and will have the following meanings in the context of the ongoing disclosure.

A "network" may refer to a series of nodes or network elements that are interconnected via communication paths. In an example, the network may include any number of software and/or hardware elements coupled to each other to establish the communication paths and route data/traffic via the established communication paths. In accordance with the embodiments of the present disclosure, the network may include, but is not limited to, the Internet, a local area network (LAN), a wide area network (WAN), an Internet of things (IoT) network, and/or a wireless network. Further, in accordance with the embodiments of the present disclosure, the network may comprise, but is not limited to, copper transmission cables, optical transmission fibers, wireless transmission, routers, firewalls, switches, gateway computers, and/or edge servers.

A "device" may refer to an apparatus using electrical, mechanical, thermal, etc., power and having several parts, each with a definite function and together performing a particular task. In accordance with the embodiments of the present disclosure, a device may include, but is not limited to, one or more IoT devices. Further, one or more IoT devices may be related to, but are not limited to, connected appliances, smart home security systems, autonomous farming equipments, wearable health monitors, smart factory equipments, wireless inventory trackers, ultra-high speed wireless internet, biometric cybersecurity scanners, and shipping container and logistics tracking. The term "device" in some embodiments, may be referred to as equipment or machine without departing from the scope of the ongoing description.

"Virtual reality" (VR) is a computer-generated environment with scenes and objects that appear to be real. This environment as may be generated as a virtually constructed building or any 3-dimensional (3D) establishment is perceived through a device such as a VR headset or helmet.

"Augmented reality" (AR) is an interactive experience of a real-world environment where the objects that reside in the real world are enhanced by computer-generated perceptual information, sometimes across multiple sensory modalities, including visual, auditory, haptic, somatosensory, and olfactory. For example, a real-world snap of plinth beam of an under-construction building may be annotated in a color code different from cantilever beam owing to different physical characteristics.

A "feature vector" is a vector containing multiple elements about or pertaining to an object. Putting feature vectors for objects together can make up a feature space. The granularity depends on what someone is trying to learn or represent about the object. In an example, a 3D feature may be enough for simulating a passage in a building as compared to a plinth beam which may require 5D features for being more sensitive structural component of a building.

A "processor" may include a module that performs the methods described in accordance with the embodiments of the present disclosure. The module of the processor may be programmed into integrated circuits of the processor, or loaded in memory, storage device, or network, or combinations thereof.

"Machine learning" may refer to a study of computer algorithms that may improve automatically through experience and by the use of data. Machine learning algorithms build a model based at least on sample data, known as "training data," in order to make predictions or decisions without being explicitly programmed to do so. Machine learning algorithms are used in a wide variety of applications, such as in medicine, email filtering, speech recognition, and computer vision, where it is difficult or unfeasible to develop conventional algorithms to perform the needed tasks.

In machine learning, a common task is the study and construction of algorithms that can learn from and make predictions on data. Such algorithms function by making data-driven predictions or decisions, through building a mathematical model from input data. These input data used to build the model are usually divided in multiple data sets. In particular, three data sets are commonly used in various stages of the creation of the model: training, validation, and test sets. The model is initially fit on a "training data set," which is a set of examples used to fit the parameters of the model. The model is trained on the training data set using a supervised learning method. The model is run with the training data set and produces a result, which is then compared with a target, for each input vector in the training data set. An example input vector is a feature vector. Based at least on the result of the comparison and the specific learning algorithm being used, the parameters of the model are adjusted. The model fitting can include both variable selection and parameter estimation.

Successively, the fitted model is used to predict the responses for the observations in a second data set called the "validation data set." The validation data set provides an unbiased evaluation of a model fit on the training data set while tuning the model's hyperparameters. Finally, the "test data set" is a data set used to provide an unbiased evaluation of a final model fit on the training data set.

"Deep learning" may refer to a family of machine learning models composed of multiple layers of neural networks, having high expressive power and providing state-of-the-art accuracy.

"Database" may refer to an organized collection of structured information, or data, typically stored electronically in a computer system.

"Data feed" is a mechanism for users to receive updated data from data sources. It is commonly used by real-time applications in point-to-point settings as well as on the World Wide Web.

"Ensemble learning" is the process by which multiple models, such as classifiers or experts, are strategically generated and combined to solve a particular computational intelligence problem. Ensemble learning is primarily used to improve the performance (classification, prediction, function approximation, etc.) of a model, or reduce the likelihood of an unfortunate selection of a poor one. In an example, an ML model selected for gathering a user intent from an input is different from an ML model required for processing a statistical input for sensitivity.

2.0 STRUCTURAL OVERVIEW

FIG. 1 illustrates an example networked computer system 100 with which various embodiments of the present disclosure may be implemented. FIG. 1 is shown in simplified, schematic format for purposes of illustrating a clear example and other embodiments may include more, fewer, or different elements. FIG. 1 and the other drawing figures, and all of the description and claims in this disclosure are intended to present, disclose, and claim a technical system and technical methods. The technical system and methods as disclosed includes specially programmed computers, using a special-purpose distributed computer system design and instructions that are programmed to execute the functions that are described. These elements execute to provide a practical application of computing technology to the problem of optimizing schedule, resource allocation, and work sequencing for AEC planning and execution. In this manner, the current disclosure presents a technical solution to a technical problem, and any interpretation of the disclosure or claims to cover any judicial exception to patent eligibility, such as an abstract idea, mental process, method of organizing human activity, or mathematical algorithm, has no support in this disclosure and is erroneous.

In some embodiments, the networked computer system 100 may include a client computer(s) 104, a server computer 106, and a data repository(ies) 130, which are communicatively coupled directly or indirectly via a network 102. In an embodiment, the server computer 106 broadly represents one or more computers, such as one or more desktop computers, server computers, a server farm, a cloud computing platform, a parallel computer, virtual computing instances in public or private datacenters, and/or instances of a server-based application. The server computer 106 may be accessible over the network 102 by the client computer 104, for example, to request a schedule or a resource recommendation and to make a query. The client computer 104 may include a desktop computer, laptop computer, tablet computer, smartphone, or any other type of computing device that allows access to the server computer 106. The elements in FIG. 1 are intended to represent one workable embodiment but are not intended to constrain or limit the number of elements that could be used in other embodiments.

The server computer 106 may include one or more computer programs or sequences of program instructions in an organization. Such organization implements artificial intelligence/machine learning algorithms to generate data pertaining to various requirements, such as design consideration factors in a construction project, controlling functions, notifying functions, monitoring functions, and modifying functions. A set of diverse or even mutually exclusive programs or sequences of instructions are organized together to implement diverse functions to generate data associated with design consideration factors. Such set may be referred to herein as a model ensemble 112 to implement an ensemble learning. Programs or sequences of instructions organized to implement the controlling functions may be referred to herein as a construction schedule supervisor controller 114 (referred to simply as "controller 114" herein). Programs or sequences of instructions organized to implement the notifying functions may be referred to herein as a notifier 116. Programs or sequences of instructions organized to implement the monitoring functions may be referred to herein as an efficiency analysis and process monitor 118 (referred to simply as "monitor 118" herein). Programs or sequences of instructions organized to implement the modifying functions may be referred to herein as a modifier 120. The controller 114, the notifier 116, the monitor 118, and the modifier 120 may be integrated together as a system on chip or as separate processors/controllers/registers. Accordingly, as may be clear from the forthcoming descriptions of the figures, the model ensemble 112, the controller 114, the notifier 116, the monitor 118, and the modifier 120 essentially correspond to generating, controlling/processing, notifying, monitoring, and modifying functions.

The model ensemble 112, the controller 114, the notifier 116, the monitor 118, and/or the modifier 120 may be part of an AI system implemented by the server computer 106. In an embodiment, the networked computer system 100 may be an AI system and may include the client computer 104, the server computer 106, and the data repository 130 that are communicatively coupled to each other. An example AI-based system is described in U.S. Provisional Application No. 63/280,881, filed Nov. 18, 2021, and titled "Method and System for Multi-Factor Optimization of Schedules and Resource Recommendations for Smart Construction Utilizing Human and Machine Cognition," and U.S. patent application Ser. No. 17/683,858, filed Mar. 1, 2022, and titled "Intelligence Driven Method and System for Multi-Factor optimization of Schedules and Resource Recommendations for Smart Construction," the entire contents of which are hereby incorporated by reference for all purposes as if fully set forth herein. In an embodiment, one or more components of the server computer 106 may include a processor configured to execute instructions stored in a non-transitory computer readable medium.

In an embodiment, the controller 114 is programmed to receive a user input, for example, via an interface such as a graphic user interface or a sensor such as an acoustic sensor, imaging sensor, etc. (not shown). The controller 114 is also programmed to determine, from the user input, an intent of a user towards fulfilling one or more construction objectives associated with a construction project such as building or bridge construction. In an example, the intent corresponds to a contextual interpretation arising from the user input and does not correspond to a literal meaning emanating from the user input. An objective, on the other hand, may correspond to an ulterior motive behind a provision associated with the user input and may not be apparent from the user input. Example intents and objectives are further elaborated in at least the description of FIG. 2A. The controller 114 may determine the user intent with or without user personalization.

In an embodiment, the model ensemble 112 may include a plurality of modules, and each of the plurality of modules may include an ensemble of one or more machine learning models (e.g., Multilayer Perceptron, Support Vector Machines, Bayesian Learning, K-Nearest Neighbor, etc.) to process a corresponding data feed. The data feed in turn corresponds to current data received in real-time from data sources such as a local or remote database as corresponding to the data feed database 132. Each module, which is a combination of plurality of ML models, is programmed to receive a corresponding data feed from the data feed database 132. Based on pertinent segments or attributes of the data feed mapping with a function objective(s), a respective module determines or shortlists an intermediary data set that includes consideration factors in a construction project. The data feed is defined by a data structure comprising a header and that includes metadata or tags at an initial section or a header of the data feed, such that the metadata or tags identify segments and corresponding data types. Alternatively, in absence of header, the metadata or tags may be mixed with payload in the data feed. For example, each data segment of the data feed may include metadata indicating a data type that the data segment pertains to. If the data type corresponds with the function objective of the respective module, then the respective module will process that data segment. The intermediary data sets may then be used by the controller 114 to execute one or more actions based on user inputs, as described in more detail herein.

For example, a Micro-Climate Analysis Module of the model ensemble 112 would only process those segments of a data feed that are relevant to the function objectives of the Micro-Climate Analysis Module (e.g., weather analysis, prediction, determination, recommendation, etc.). Put differently, the Micro-Climate Analysis Module identifies and processes those segments that have metadata indicating, for example, a weather data type. If a data feed includes only weather data, then the Micro-Climate Analysis Module would process the entire data feed. If a data feed does not include any weather data, then that data feed is not processed by the Micro-Climate Analysis Module.

In an embodiment, the notifier 116 may be programmed to provide notifications to the user. The notifier 116 may receive data from the controller 114 and/or the data repository 130 and generate notifications in response to the data received from the controller 114 and/or the data repository 130. The notifications may be indicated or rendered in a user interface (e.g., a graphical user interface) to the user. The notifications may include, but not limited to, audio, visual, or textual notifications in the form of indications or prompts. In one example, the notifications may include, but not limited to, one or more recommended actions to fulfill the construction objectives based on an intent of the user. In another example, a notification indicates digital simulation of a real-world appearance of a construction site as a virtual environment (e.g., a metaverse of an under-construction building). In another example, a notification indicates a superimposition/overlay of the virtual environment on a real-time visual data feed of the construction site (e.g., a virtual view of a constructed bare ceiling superimposed by virtual wooden beams). In another example, a notification allows an avatar or personified animation of the user to navigate the virtual environment for visual introspection through a virtual reality headgear worn over the head, a stylus pen held in hand, and/or other means as known in the state-of-the-art. Based on a head or limb movement of the user, for example, wearing the virtual reality headgear, the avatar may walk-through or drive-through various virtual locations of the metaverse. In another example, a notification facilitates such avatar to make real-time changes/updates/annotations that affect upcoming construction of the construction project. In another example, the notification facilitates the avatar's interaction with avatars of other users in a collaborative virtual environment. In another example, a notification indicates a transition between a virtual view and a real-world view of the construction site. In another example, a notification indicates construction details such as cost information and/or construction materials used.

In an embodiment, the monitor 118 is programmed to receive feedback that may be used to execute corrections and alterations at the controller 114 side to fine tune decision making. Example feedback may be manually provided by the user via an input interface (e.g., graphical user interface) about issues and problems such as construction status, delays, etc., or may be automatically determined by the monitor 118. In an example, the current status regarding the construction may be compared by the monitor 118 with an earlier devised proposal to detect deviations and thereby detect the issues and problems. For such purposes, the monitor 118 is also programmed to receive data feeds from one or more external sources, such as on-site sensors or videos, and to store the data feeds in the data repository 130.

In an embodiment, the modifier 120 is programmed to receive modification data to update existing artificial intelligence models in the system 100 and to add new artificial intelligence models to the system 100. Modification data may be provided as input by the user via an input interface (e.g., a graphical user interface). Modifications may also be sensed automatically through state-of-the-art sensors such as an acoustic or imaging sensor. In an example, the sensors may be configured as system on chip (SoC) and comprise electronics to log the user-inputs as received over a period of time and monitor trends within the logged inputs. In case of significant deviations or anomalies within the incoming input or between the incoming input and output as finally generated, an alert or trigger may be provided, for example, as feedback to update existing AI models to compensate for the sensed anomalies and deviations.

In some embodiments, in keeping with sound software engineering principles of modularity and separation of function, the model ensemble 112, the controller 114, the notifier 116, the monitor 118, and the modifier 120 are each implemented as a logically separate program, process, or library. They may also be implemented as hardware modules or a combination of both hardware and software modules without limitation.

Computer executable instructions described herein may be in machine executable code in the instruction set of a Central Processing Unit (CPU) and may be compiled based upon source code written in Python, JAVA, C, C++, OBJECTIVE-C, or any other human-readable programming language or environment, alone or in combination with scripts in JAVASCRIPT, other scripting languages, and other programming source text. In another embodiment, the programmed instructions may also represent one or more files or projects of source code that are digitally stored in a mass storage device such as non-volatile Random Access Memory (RAM) or disk storage, in the system of FIG. 1 or a separate repository system, which when compiled or interpreted cause generation of executable instructions that in turn upon execution cause the computer to perform the functions or operations that are described herein with reference to those instructions. In other words, the figure may represent the manner in which programmers or software developers organize and arrange source code for later compilation into an executable, or interpretation into bytecode or the equivalent, for execution by the server computer 106.

The server computer 106 may be communicatively coupled to the data repository 130 that includes a data feed database 132, a construction objectives (CO) database 134, a model configuration database 136, a training data database 138, and a recommendation database 140.

In some embodiments, the data feed database 132 may store a plurality of data feeds collected from various sources such as a construction site or an AEC site, third-party paid or commercial databases, and real-time feeds, such as Really Simple Syndication (RSS), or the like. A data feed may include data segments pertaining to real-time climate and forecasted weather data, structural analysis data, in-progress and post-construction data, such as modular analysis of quality data, inventory utilization and forecast data, regulatory data, global event impact data, supply chain analysis data, equipment and IoT metric analysis data, labor/efficiency data, and/or other data that are provided to the modules of the model ensemble 112 in line with respective construction objective(s). A data feed may include tenant data relating to either other ancillary construction projects or activities of such ancillary construction projects, or both. Each data segment may include metadata indicating a data type of that data segment. As described herein, the real-time data, near real-time data, and collated data are received by the monitor 118 and are processed by various components of the server computer 106 depending on the user intent and construction objectives.

In some embodiments, the CO database 134 includes a plurality of construction objectives. Each of the plurality of data feeds in the data feed database 132 is processed to achieve one or more construction objectives of the plurality of construction objectives in the CO database 134. The construction objectives, as exemplified in forthcoming description, are a collection of different user requirements, project requirements, regulatory requirements, technical requirements, or the like. Construction objectives may be established prior to start of construction activities and can be adjusted during construction phases to factor in varying conditions. Construction objectives are defined at each construction project and construction phase level. Data definition of construction objectives defines normalized construction objectives. Examples of such normalized objectives include parameters for optimization of construction schedule to meet time objectives, optimization for cost objectives, optimization for carbon footprint objectives, which are normalized to factor in worker health, minimize onsite workers, and minimize quality issues. One or more construction objectives may be identified as part of a schedule request for a construction activity of a construction project. Further, the objective may be determined from the user input and/or the intent based on a natural language parser and a work tokenizer.

In one example, a construction objective may be to keep the cost below a budgeted amount. The monitor 118 may receive data feeds corresponding to cost analysis from external sources and store the data feeds in data feed database 132. The controller 114 may receive the data feeds from the data feed database 132, or alternatively, receive the data feeds from the monitor 118. The controller 114 may then check the received data feeds against the established objectives (e.g., a set benchmark or threshold) to be in alignment for set construction objectives stored in the CO database 134. While the set benchmark corresponds to a predefined metric, the set objective corresponds to an objective created in real time based on the user input and specifically the user intent. For example, if the incoming data feeds indicate that construction completion date may exceed a deadline, then the controller 114 explores one or more solutions to expedite. In this context, the controller 114 may determine that reshuffling of tasks, adding additional construction workers, and procuring materials from a nearby supplier even at the cost of higher expenditure than proposed budget is expected to minimize shipping time and eventually help in meeting the proposed deadline associated with the completion date. However, since the desired objective is also to keep the cost below or at the allotted budget level, system recommendation from the controller 114 might also resort to overlook expediency and instead maintain work at the current pace with the current mandates. Such system recommendation to ignore expediency and persist with the current pace and resources is expected to have checked the CO database 134 as well as any other legal commitments, before giving up the options to expedite and persist with current pace. In a different exemplary scenario, if the construction objective may be to honor the set construction completion date at the cost of preset budget, then the system recommendation may override the current pace of work and instead enforce its explored recommendations to expedite, e.g., adding additional construction workers, procuring material from a nearby supplier among other considerations.

In an embodiment, the model configuration database 136 may include configuration data, such as parameters, gradients, weights, biases, and/or other properties, that are required to run the artificial intelligence models after the artificial intelligence models are trained. The configuration data may be continuously updated.

In an embodiment, the training data database 138 may include training data for training one or more artificial intelligence models of the system 100. The training data database 138 is continuously updated with additional training data obtained within the system 100 and/or external sources. Training data includes historic customer data and synthetically algorithm-generated data tailored to test efficiencies of the different artificial intelligence models described herein. Synthetic data may be authored to test a number of system efficiency coefficients. This may include false positive and negative recommendation rates, model resiliency, and model recommendation accuracy metrics. An example of training data set may include data relating to task completion by a contractor earlier than a projected time schedule. Another example of training data set may include data relating to quality issues on the work completed by the contractor on the same task. Another example of a training data set may include several queries on construction projects received over a period of time from multiple users as user inputs. Yet another example of a training data set may include a mapping between queries and associated user intent for each query. The controller 114 may refer to this mapping while determining a new query from a user on an associated construction project.

In an embodiment, the recommendation database 140 includes recommendation data such as recommended actions to optimize schedules to complete a construction project. Schedule optimization includes a shortest path for meeting the construction objective(s), selective work packages to include supplier recommendation (for example, based on proximity, quality, cost, etc.) and contractor recommendation. An example construction schedule includes all tasks ordered by priority, grouped tasks known as work packages, and resources assigned to the tasks. As discussed herein, schedule optimization is dynamic in nature as it relies and adjudicates based upon the current schedule progression, anticipated impedance, and impact due to quality issues and supply constraints.

The data repository 130 may include additional databases storing data that may be used by the server computer 106. Each database 132, 134, 136, 138, and 140 may be implemented using memory, e.g., RAM, EEPROM, flash memory, hard disk drives, optical disc drives, solid state memory, or any type of memory suitable for database storage.

The network 102 broadly represents a combination of one or more LANs, WANs, metropolitan area networks (MANs), global interconnected internetworks, such as the public internet, or a combination thereof. Each such network may use or execute stored programs that implement internetworking protocols according to standards such as the Open Systems Interconnect (OSI) multi-layer networking model, including but not limited to, Transmission Control Protocol (TCP) or User Datagram Protocol (UDP), Internet Protocol (IP), Hypertext Transfer Protocol (HTTP), and so forth. All computers described herein may be configured to connect to the network 102 and the disclosure presumes that all elements of FIG. 1 are communicatively coupled via the network 102. The various elements depicted in FIG. 1 may also communicate with each other via direct communication links that are not depicted in FIG. 1 to simplify the explanation.

3.0 FUNCTIONAL OVERVIEW

The server computer 106, including the model ensemble 112, the controller 114, the notifier 116, the monitor 118, and the modifier 120, and the data repository 130 interoperate programmatically in an unconventional manner, depending on use requirements, to determine a user intent of a user from an input, generate a feature set based on the user intent, and process at least one data feed based on the user intent to select a plan of action for executing at least one intended task.

3.1 Model Ensemble

In an embodiment, the model ensemble 112 of FIG. 1 includes a plurality of modules that communicate with each other. Each of the plurality of modules includes an ensemble of one or more machine learning models to process data feeds.

Machine learning models disclosed herein may include appropriate classifiers and ML methodologies. Some of the ML algorithms include (1) Multilayer Perceptron, Support Vector Machines, Bayesian Learning, K-Nearest Neighbor, or Naive Bayes as part of supervised learning, (2) Generative Adversarial Networks as part of Semi-Supervised Learning, (3) Unsupervised Learning utilizing Autoencoders, Gaussian Mixture, and K-means clustering, and (4) Reinforcement Learning (e.g., using a 0-learning algorithm, using temporal difference learning, etc.), and other suitable learning styles. Knowledge transfer is applied, and for small footprint devices, Binarization and Quantization of models is performed for resource optimization for ML models. Each module of the plurality of ML models can implement one or more of a regression algorithm (e.g., ordinary least squares, logistic regression, stepwise regression, multivariate adaptive regression splines, locally estimated scatterplot smoothing, etc.), an instance-based method (e.g., k-nearest neighbor, learning vector quantization, self-organizing map, etc.), a regularization method (e.g., ridge regression, least absolute shrinkage and selection operator, elastic net, etc.), a decision tree learning method (e.g., classification and regression tree, iterative dichotomiser 3, C4.5, chi-squared automatic interaction detection, multivariate adaptive regression splines, gradient boosting machines, etc.), a Bayesian method (e.g., naïve Bayes, averaged one-dependence estimators, Bayesian belief network, etc.), a kernel method (e.g., a support vector machine, a radial basis function, a linear discriminate analysis, etc.), a clustering method (e.g., k-means clustering, expectation maximization, etc.), an associated rule learning algorithm (e.g., an Eclat algorithm, etc.), an artificial neural network model (e.g., a Perceptron method, a back-propagation method, a self-organizing map method, a learning vector quantization method, etc.), a deep learning algorithm (e.g., a restricted Boltzmann machine, a deep belief network method, a convolution network method, a stacked auto-encoder method, etc.), and a dimensionality reduction method (e.g., principal component analysis, partial least squares regression, multidimensional scaling, etc.). Each processing portion of the system 100 can additionally leverage a probabilistic, heuristic, deterministic, or other suitable methodologies for computational guidance, recommendations, machine learning, or combination thereof. However, any suitable machine learning approach can otherwise be incorporated in the system 100. Further, any suitable model (e.g., machine learning, non-machine learning, etc.) can be used in the system 100 of the present disclosure.

The model ensemble 112 may include modules and additional features described in U.S. Provisional Application No. 63/280,881, filed Nov. 18, 2021, and titled "Method and System for Multi-Factor Optimization of Schedules and Resource Recommendations for Smart Construction Utilizing Human and Machine Cognition," and U.S. patent application Ser. No. 17/683,858, filed Mar. 1, 2022, and titled "Intelligence Driven Method and System for Multi-Factor optimization of Schedules and Resource Recommendations for Smart Construction," the entire contents of which are hereby incorporated by reference for all purposes as if fully set forth herein.

3.2 Controller

In an embodiment, the controller 114 of FIG. 1 may implement a combination of AUML algorithms along with natural language processing (NLP) and natural language understanding (NLU) to understand the intent of the user from the user input. For example, if the user input includes a statement "Are we on schedule for this project?", the controller 114 may interpret that the user is interested in knowing the timeline of the completion (i.e., temporal intent). In another example, the user input may include a statement "Construct a 10-story building with minimum delay and expenses." The controller 114 may interpret this as temporal and fiscal intent of the user for the specified construction. For example, the "minimum delay" and "minimum expenses" as keywords are extracted and classified under the genre "temporal" and "fiscal" by the NL parser and/or a word tokenizer as a part of intent extraction and analysis. In another example, generator adversarial or discriminator-based ML network may be appended to the NI, parser to precisely find the genre or label as "temporal" or "fiscal." Likewise, using the similar concepts and/or analogous technologies, if the user input includes an instruction "Let's minimize wastage while constructing this building," the controller 114 may interpret this as a societal intent to minimize wastage and reduce environmental impact. Likewise, in another scenario, wherein the user input is gesture-based, or code-word based, decryption and gesture recognition-based algorithms may be employed to decipher the intent underlying the user input.

For example, the controller 114 may be configured to derive a user intent from the NL-based content from the provided user input by a tokenizing operation, i.e., breaking the user input into words using tokenization technique of space characters. Thereafter, as a part of normalization operation, non-standard words are converted to standard words. This may be achieved using text simplification techniques or other predefined techniques. Thereafter, an intent may be obtained from the normalized text through various techniques such as unsupervised learning, dimensionality reduction, or clustering. Such techniques may be technically referred by a NMF (Non-negative Matrix Factorization), LSA (Latent Semantic Analysis), LDA (Latent Dirichlet Allocation), etc.

For generating personalized user intents, the same may be adaptively predicted by an automated assistant as enabled by the aforesaid AI and ML networks. In an example, the personalized user intent may be determined based on computing one or more probable intents through a probabilistic network, such as a Bayesian Network. For such purposes, a user profile-based log is accessed (for example, from a cloud server, the data repository 130, etc.) as a first personalization measure to determine user preferences, job profile, ethnicity, current location, prior expressed intents, etc. A similarity may be calculated between the current user input and prior expressed intents along with other parameters, and thereupon, a set of intents mapping with the user unput may be determined. Thereafter, as a second degree of personalization and an optional measure, a local database present in a user device (for example, client computer 104) may be accessed to access pre-stored intent-input pairs, and a similarity score may be computed between a) the set of intents and the current user input, and b) pre-stored intent-input pairs. One or more intents with highest similarity scores (e.g., top five intents) may be shortlisted during the second degree of personalization-based measure. Further, a topmost intent is subsequently selected as a first preference out of the shortlisted intents as determined during the second degree of personalization-based measure. The intents, of the shortlisted intents, having similarity score below the topmost intent are reserved for later consideration as a standby mode as referred in forthcoming description.

The aforesaid shortlisted intents, including the topmost intent, correspond to personalized intents that are specific to the user. For example, User A's intention for the input "Are we on schedule for this project?" may be different from User B's intention for the same input. User A may expect a more detailed response than User B. The personalized intents so generated compensate any shortfall or expectation gaps by having been based on aforesaid historical data and/or user-specific information.

In an implementation and a matter of further augmenting personalization based on closed loop or feedback system, a user review of the topmost intent is received as a matter of quality control in real-time as an immediate next step (e.g., in a graphical user interface) after locating the topmost intent. A positive review leads to registration of the topmost intent with the current user input into the local database to create the intent-input pair for further look up. In another example, a negative review as a part of the user feedback towards the topmost intent leads to rejection of the topmost intent. In response to said rejection, the intent, from the aforesaid standby mode, with the next highest similarity score is chosen and presented for user review. This next intent has a similarity score lower than the topmost intent but has the highest similarity score amongst the intents in the standby mode. A positive review of this next intent from the user leads to registration as referred aforesaid with respect to topmost intent. However, a further negative review of this next intent and likewise for all computed intents in the standby mode leads to updating of the user profile-based log residing at a cloud server or the data repository 130. Such updating, in an example, comprises retraining of the ML model residing at the cloud server or the data repository 130 to update the user profile-based log and thereby mitigate a probability of future rejection of the shortlisted intents.

The controller 14 may include additional features described in U.S. Provisional Application No. 63/280,881, filed Nov. 18, 2021, and titled "Method and System for Multi-Factor Optimization of Schedules and Resource Recommendations for Smart Construction Utilizing Human and Machine Cognition," and U.S. patent application Ser. No. 17/683,858, filed Mar. 1, 2022, and titled "Intelligence Driven Method and System for Multi-Factor optimization of Schedules and Resource Recommendations for Smart Construction," the entire contents of which are hereby incorporated by reference for all purposes as if fully set forth herein.

3.3 Notifier

In an embodiment, the notifier 116 of FIG. 1 is configured to generate overlays upon a base image through processing of the user input by a generator adversarial network (GAN) and a discriminator network. For such purposes and in an example, the notifier 116 comprises a graphics-only processing unit such as a graphics processing unit (GPU), a visual processing unit (VPU), and/or an AI-dedicated processor such as a neural processing unit (NPU).

The embodiments presented herein may be leveraged to render geospatial overlays in the realm of geographic information system (GIS) that superimpose different type of data sets together and thereby creates a composite map by combining the geometry and attributes of different data sets. In an example, the geospatial overlays or GIS overlays are dependent upon environmental factors such as topography, terrain, climate, etc., of particular area and also due to non-environmental factors such as resource availability, traffic conditions, demography, supply-chain influencing a particular area or locality, etc. In an example, the subject matter of present disclosure, when applied to render the geospatial overlay, can be used to find an optimum location to construct a new school, hospital, police station, industrial corridors, etc. Such optimum location may be found, for example, based on environmental factors such as climatic condition or topography, such as flat area for school building. Non-environmental factors or commercial attributes influencing the optimum location selection may include nearness to recreation sites, and far from existing schools, etc.

Other example applications of the present embodiment with respect to overlays include providing material overlay (e.g., for flooring), smart building overlays in construction industry, cost overlays, and temporal overlays in natural language processing. As may be understood, smart building overlays may in turn be based on a plurality of factors such as lighting, temperature optimization, material optimization, etc.

The notifier 116 may include additional features described in U.S. Provisional Application No. 63/280,881, filed Nov. 18, 2021, and titled "Method and System for Multi-Factor Optimization of Schedules and Resource Recommendations for Smart Construction Utilizing Human and Machine Cognition," and U.S. patent application Ser. No. 17/683,858, filed Mar. 1, 2022, and titled "Intelligence Driven Method and System for Multi-Factor optimization of Schedules and Resource Recommendations for Smart Construction," the entire contents of which are hereby incorporated by reference for all purposes as if fully set forth herein 3.4 Monitor In an embodiment, the monitor 118 of FIG. 1 receives feedback regarding recommendations and/or the construction project. Example feedback includes manual or direct feedback input by users and automated or indirect feedback determined by the server computer 106, such as by the monitor 118. Based on the feedback, the controller 114 generates a further optimized schedule (updated/revised optimized schedule) for the construction project.

In an embodiment, the monitor 118 assists the modules of the model ensemble 112 to collect input data sets (e.g., data feeds) from one or more external sources, store the input data sets in the data feed database 132, and transmit the input data sets to various components of the system 100, such as to the modules of the model ensemble 112 or to the controller 114, from the data feed database 132.

The monitor 118 may include additional features described in U.S. Provisional Application No. 63/280,881, filed Nov. 18, 2021, and titled "Method and System for Multi-Factor Optimization of Schedules and Resource Recommendations for Smart Construction Utilizing Human and Machine Cognition," and U.S. patent application Ser. No. 17/683,858, filed Mar. 1, 2022, and titled "Intelligence Driven Method and System for Multi-Factor optimization of Schedules and Resource Recommendations for Smart Construction," the entire contents of which are hereby incorporated by reference for all purposes as if fully set forth herein.

3.5 Modifier

In an embodiment, the modifier 120 of FIG. 1 receives user input to configure one or more machine learning models or to add new machine learning models by using a management console. The management console may serve as an input interface (e.g., a graphical user interface) for communicating with or configuring one or more components of the server computer 106. The management console may be implemented by the modifier 120, or may be embodied in one or more private or public-computing servers, and/or be a component of a distributed computing system or a cloud.

The modifier 120 may include additional features described in U.S. Provisional Application No. 63/280,881, filed Nov. 18, 2021, and titled "Method and System for Multi-Factor Optimization of Schedules and Resource Recommendations for Smart Construction Utilizing Human and Machine Cognition," and U.S. patent application Ser. No. 17/683,858, filed Mar. 1, 2022, and titled "Intelligence Driven Method and System for Multi-Factor optimization of Schedules and Resource Recommendations for Smart Construction," the entire contents of which are hereby incorporated by reference for all purposes as if fully set forth herein.

4.0 PROCEDURAL OVERVIEW

Figure 2A:
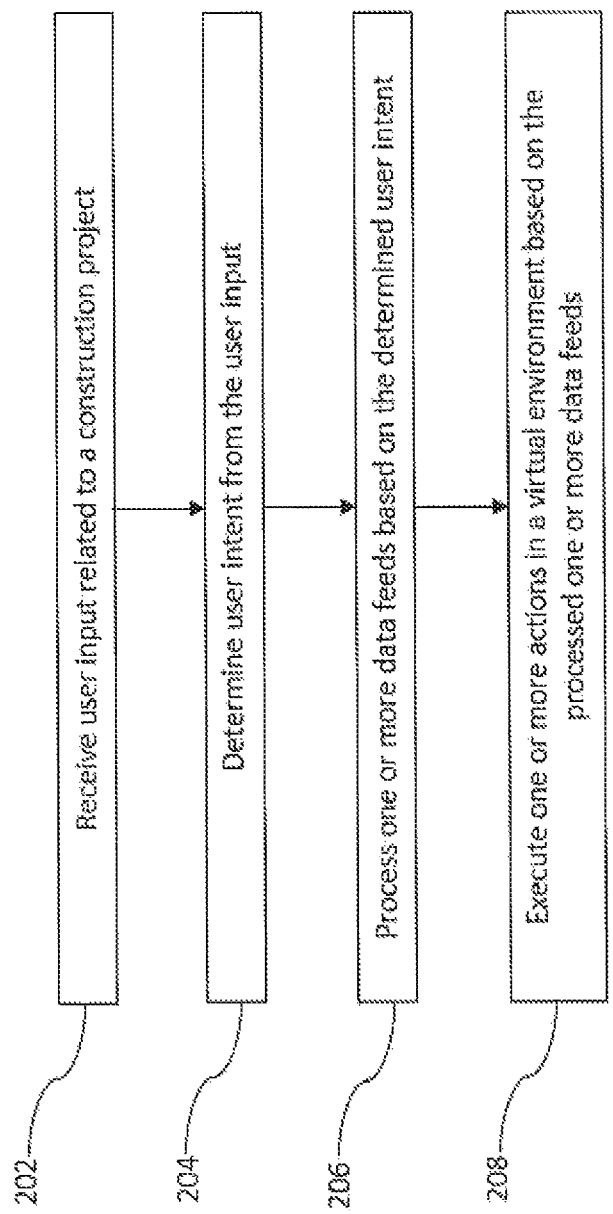
FIG. 2A illustrates an example method for intent-based factorization and computational simulation, in accordance with the embodiments presented herein.
Figure 2B:
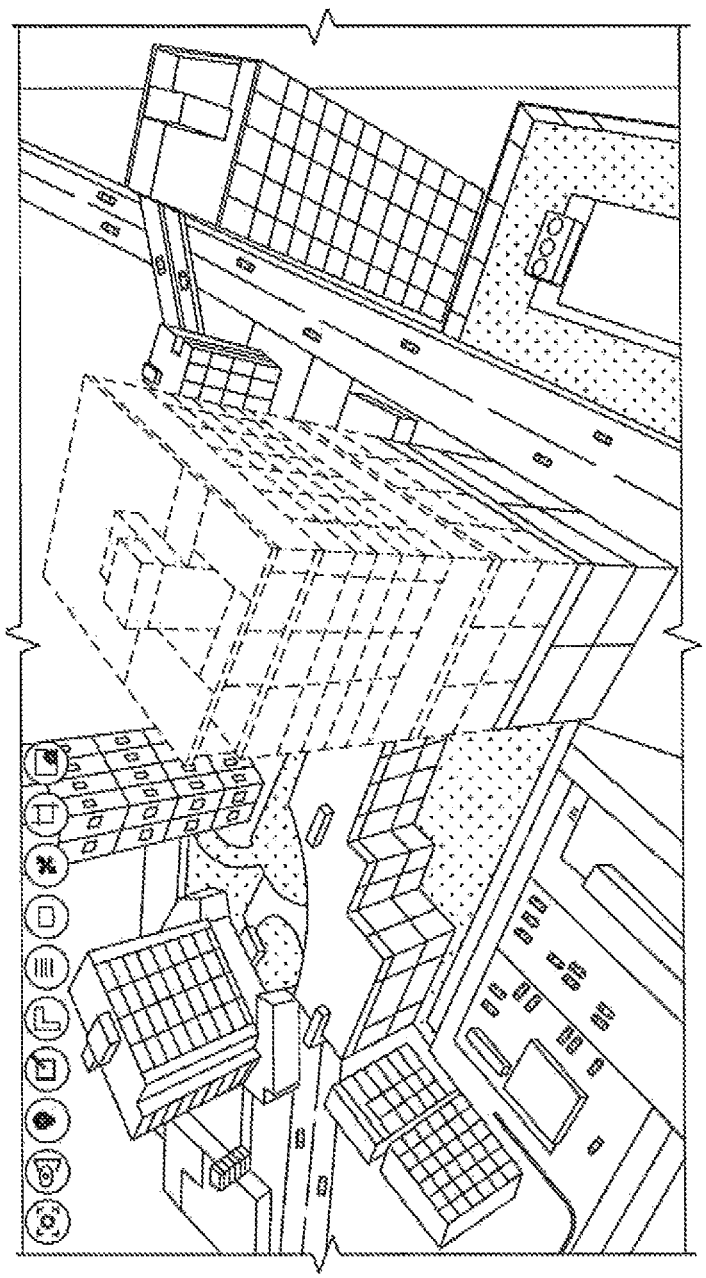
FIG. 2B illustrates an example simulation of a to-be-constructed building as a virtual or augmented reality, in accordance with an embodiment of the present disclosure.

FIG. 2A illustrates an example method for intent-based factorization and computational simulation, in accordance with the embodiments presented herein. FIG. 2B illustrates an example simulation of a to-be-constructed building as a virtual or augmented reality, in accordance with an embodiment of the present disclosure. FIG. 2A and FIG. 2B will be explained in conjunction with the description of FIG. 1. The steps of FIG. 2A may be continuously repeated during a simulation session.

In FIG. 2A, in step 202, the server computer 106 may receive a user input from a user via the client computer 104 in relation to a task or a construction project to be executed. For instance, a user may provide the user input in a text, an image, a video, or an audio format to the client computer 104. The task may be identified through state-of-the-art natural language processing techniques, image processing techniques, audio processing techniques, etc., based on the type of user input. In an example, in case of NL-based user input, the input may be subjected to NLP techniques comprising tokenization, normalization, past of speech generation, name-entity identification, word embedding, etc. The client computer 104 may transmit the received user input to the server computer 106 via the network 102.

In one example, the user input may include a query, an instruction, and/or an electronic file related to the construction project acting as the task to be performed. For instance, one user input may be a query regarding the progress of a construction project, materials used for the construction project, a location of the construction project, a projected timeline of completion, and/or any changes in construction activity to expedite the completion of the construction project. In an embodiment, the user input may include an instruction to create a virtual representation of a construction project based on a construction blueprint provided by the user. The blueprint may include artefacts such as, but not limited to, a computer aided design (CAD) documentation, a 2D floor plan, and/or a 3D architecture layout to construct a 3D digital/virtual representation (e.g., metaverse) of the construction project based on a building information model (BIM). In an embodiment, the user input may include an instruction to create the virtual representation of the construction project based on an intent of the user, without any specific artefact provided by the user. For instance, the user may provide a verbal input as "create a 5-story building with minimal environmental impact" or "show cost-effective ways to install wooden beams on the roof of $1^{st}$ floor." Accordingly, the user input is parsed, for example, through an NL parser to determine keywords and thereby determine intent and objective as further detailed in step 204.

In an embodiment, the user input may include an instruction to superimpose a real-time data feed (real-world view) of a construction project on a virtual representation of the construction project. For example, as shown in FIG. 2B, a CAD diagram of a 5-story building (as shown in dashed lines) may be superimposed by real-time data over an already constructed first floor (as shown in solid lines) and amidst already existing habitation such as preexisting surrounding building, parking lot, flyover, roads, etc. (as also shown in solid lines). In another example, the CAD diagram of the entire building (if yet to be constructed) may be instantiated or superimposed by the real-time data over an actual image or simulation of a locality, zone, land parcel, or plot to visualize the construction. The representation of FIG. 2B may be a virtual reality, wherein all the entities are animated or an augmented reality, wherein merely the to-be-constructed building or building floors are animated and remaining representation may be a real-life photograph of site comprising the habitation.

In an embodiment, the user input may include an instruction to facilitate navigation of an avatar of the user in the virtual environment (may also include the superimposed real-time view). In one example, the user input may include an instruction to facilitate a virtual walk-through or drive-through of a live construction site such as the simulated $5^{th}$ floor of the building as shown in FIG. 2B. Inside the example simulated floor, a bare ceiling is superimposed by real-time view of wood beams being constructed.

In an embodiment, the user input may include an instruction to facilitate the avatar to make visual modifications or annotations on the virtual representation of any portion of the construction project. Another user input may be an instruction to activate interaction of the avatar with avatars of other users in a multi-user collaborative environment (e.g., the avatar of the user may interact with the avatar of the project manager on future course of action of the construction project).

In an embodiment, the functions of the server computer 106 may be personified into a virtual AI-assistant as an avatar. In one example, the avatar may be named as 'Adam.' In this embodiment, the user may interact with Adam (virtual reality avatar) to provide all the above-described user inputs. Adam may respond to the user with suitable responses and/or actions in response to the user inputs based on the following steps. For example, the user wearing the virtual reality headgear moves his head up. Accordingly, Adam, in the virtual reality environment, also bends his head upwards so that a roof of the building may be seen to the user. In case the user now bends his hand carrying a stylus pen, Adam may actually annotate or scribble a note for the part of the roof as mentioned to be followed up. Other means such as joystick or even bare hand movement is also conceivable as a part of navigation and annotation. For enabling Adam to actually walk through the virtual reality environment, for example, to enter one room from another, the user wearing the virtual reality headgear may execute a slight leg movement in a particular direction.

In step 204, the controller 114 may determine a user intent of the user from the user input as provided for the performance of a task, which may be the construction project in some scenarios. Thereafter, the user intent as determined may be computed as a feature set or feature vector for processing by an ML model as explained herein. Specifically, the intent of the user implies preferences of the user to incorporate features that may impact the physical construction of a project. In one example, these features may be based on a multi-dimensional design model (e.g., a 10D design model) that takes into consideration a plurality of factors (e.g., 10 factors, etc.) such as, but not limited to, X, Y, and Z coordinates of position coordinate system, cost, sustainability, safety, facility management, lean construction principles, and industry standards for constructions. In an example, the plurality of factors may be territorial and location specific such that factors may depend upon topography, terrain, climate, etc., of a particular area. The factors also vary due to non-environmental factors such as resource availability, traffic conditions, demography, supply chain influencing a particular area or locality, etc. The extent of factors may be high (e.g., a 15D model) for a densely populated city such as New York as compared to sparsely populated area such as Louisville which may manage with a 5D or 6D model. The embodiments presented herein enable these factors to be considered during the virtual construction of the construction project before initiating the physical construction, which makes the construction process more efficient compared to conventional AEC mechanisms. For instance, a user intent may include incorporating safety principles. The virtual construction may accordingly include earthquake-resistant mechanisms or fire-resistant mechanisms in the virtual representation of the construction project. If a user intent includes lean construction principles, the virtual representation may include usage of raw materials that require minimum wastage. The feature set or feature vector may include any of these factors.

The intent of the user may include one or more of a temporal intent (e.g., intent related to timelines associated with the construction project), a spatial intent (e.g., intent related to location of the construction project), a fiscal intent (e.g., intent related to financial aspects of the construction project), and/or a societal intent (e.g., intent related to societal or environmental factors). The intent may be determined with or without user personalization.

In step 206, the model ensemble 112 defining an ensemble learning may process one or more data feeds received from the data feed database 132 based on the user intent determined by the controller 114 to generate intermediary data sets, which are subsequently used by the controller 114 at step 208. In one example, if the user intent is to save cost of raw materials used for construction, the model ensemble 112 may automatically process data feed(s) related to real-time cost quotes of several raw material suppliers and accordingly, evaluate the suppliers to select the most relevant suppliers for the construction project. For instance, in a just-in-time (JIT) inventory related scenario, the model ensemble 112 may access from the data feed database 132, real-time inventory data, supplier information, and cost quotes of global suppliers to present an inventory proposal to the user.

In another example, if the user intent is to annotate objects or mark-ups on the virtual representation of a 5-story under-construction building, the model ensemble 112 may process the live-feed from cameras installed in the under-construction building to further enable the notifier 116 at superimposing a completed portion (e.g., first floor) on the virtual representation of the entire 5-story building. As aforementioned, the model ensemble 112 may include a plurality of modules, and each of the plurality of modules may include an ensemble of one or more machine learning models (e.g., Multilayer Perceptron, Support Vector Machines, Bayesian Learning, K-Nearest Neighbor, etc.) to process a corresponding data feed. Based on pertinent segments or attributes of the data feed mapping with a function objective(s), a respective module determines or shortlists an intermediary data set that includes consideration factors in a construction project. If the data set corresponds with the function objective of the respective module, then the respective module will process that data segment. The intermediary data sets may then be used by the controller 114 to execute one or more actions based on user inputs, as described in more detail herein. For example, a Micro- Climate Analysis Module of the model ensemble 112 would only process those segments of a data feed that are relevant to the function objectives of the Micro-Climate Analysis Module (e.g., weather analysis, prediction, determination, recommendation, etc.).

In step 208, the controller 114 selects at least one plan of action for executing at least one intended task based on processing the data feed and thereby, executes one or more selected plan of actions in the virtual environment based on the processed data feeds (e.g., intermediary data sets). A plurality of actions forming a part of the plan of action may include a response to additional user's inputs or performing the at least one intended task according to the user intent to fulfill the construction objectives or the one or more objectives associated with the task to be performed. The actions may be simulated in a graphical user interface as virtual or augmented reality based on the feature set (as related to the intent) as a response to the user input from the user. The simulation may also be directed to cause performance of an operation in furtherance of the user intent as determined in preceding steps.

In one example, the actions may include providing recommendations on construction activities that is implemented according to the user intent and to fulfill the construction objectives. The recommendations pertain to a plurality of activities to be implemented according to the user intent for performance of the task. The actions may alternately or additionally, include a default construction plan for a construction object in order to enable the virtual representation at meeting the construction objectives. The actions may alternately or additionally, include rendering a virtual environment as a virtual reality that includes the virtual representation of the construction project, a virtual navigation (e.g., walk-through, drive-through, or a drone-view) in the virtual representation for visual introspection. For example, an under-construction building may be simulated such that Adam (as mentioned above) personifying the user can virtually walk from one room to another based on gestures, head, limb movements, etc., executed by the user wearing the virtual reality headgear. At a particular position in the virtual environment, a head raise executed by the user in real life leads Adam to also look skywards in the virtual environment and see the roof of the building under construction therein. In another example as a part of augmented reality, a superimposition of real-time data of the construction project may be performed over the virtual representation to display a real-time progress of the construction project. The augmented reality may comprise an actual image of a site augmented by at least one content item (a graphical object, text, or audio) representing any construction requirements or any information associated with one or more portions of the actual image. In another example as a part of virtual reality, user-annotated markups on the virtual representation of the construction project may be shown as a part of the simulation.

Largely, the simulation in a graphical user interface either as virtual reality or augmented reality corresponds to simulation of the plan of action for the at least one intended task in accordance with at least one objective related to the at least one intended task. In an example, the simulation of the plan of action includes simulation of a plurality of construction requirements of a project as the augmented reality. In another example, the simulation through virtual or augmented reality supports multi-contour terrain navigation with an ability to swap terrain. Further, a backdrop of augmented reality may be based on drone or vehicle-based inspection and exhibits a traversal and visual introspection.

In an example of augmented reality, the topography may be simulated against the backdrop of real-world features. Furthermore, augmented reality may support injection of real-world scenarios to simulate an impact in real time upon actual physical attributes and physical needs of a building. As part of both augmented and virtual reality, multiple users may be teleported into the digital world in "avatar" form for multi-user real-time simulations. In another example, on the lines of state-of-the-art AI assistants such as Amazon's "Alexa" and Apple's "Siri", a personified AI assistant in the form of bot applications may be provided to modify or auto-correct the user inputs provided in real time. Such bot applications may work in tandem or independently with respect to the above-mentioned Adam based application.

These actions may be triggered by the user inputs described in step 202. In an embodiment where the user input is provided to the personified virtual AI assistant, the virtual AI assistant may execute some or all the above-described actions in the virtual environment. Alternately or additionally, some or all these actions may be executed without the virtual AI assistant and the corresponding notifications may be displayed via a graphical user interface to the user.

In an embodiment, the construction of the virtual representation of the construction project incorporates real-world simulation of factors that could impede the construction schedule and/or optimal completion of the physical building. In one example, the model ensemble 112 may determine the potential impact of physical environmental factors such as direction of rain, velocity of wind, impact of heat, and probability of floods on the construction project and accordingly, construct the virtual representation. For instance, the controller 114 may modify the attributes of walls, windows, or pillars of the virtual representation to incorporate real-world construction requirements. In another example, the controller 114 may recommend actions to reduce fuel wastage in heavy machinery used for the construction project.

The embodiments presented herein further enable machine learning of construction trends over a period of time and implement the learning to customize the actions to a specific user preferences/intent. Therefore, the user may experience an optimal construction solution before the physical construction is initiated. Based on a prior construction data or historical data, factors that influence construction over a period of time or various instants of time are obtained. In an example, such factors include construction schedule dependencies and indicate as to what sets of actions may be done together or independently to optimize a schedule associated with achieving various outcomes such as wall finishing, surface treatment, curing, synthetic application of paints, etc. Alongside, timelines for achieving outcomes may be predicted (e.g., a duration of time for achieving each of the outcome). Furthermore, resources needed and human effort involved for achieving each of the outcomes may be predicted. Additionally, the outcomes sharing common traits may be grouped or clustered based on aforesaid historical data and prior empirical data. The aforesaid factors, predicted timelines, etc., may be augmented with additional predictions such as information about weather, and type of material (to be used or not used). From prior learnings, training data set, and application of a trained machine learning network such as a neural network, a prefabricated unit or artefact may be recommended for usage that is fabricated offsite and merely assembled on site, thereby doing away with a manufacturing overhead onsite.

In view of the above description, the embodiments presented herein enable the carrying of session-based identity information along with its security posture and the identity's application access credentials, from the source device to the destination device during the session. The embodiments presented herein also enable a data-plane function that performs a continuous vetting (verification) of the identity over the application access session and implement necessary action when the vetting fails. In the conventional network security mechanism, a solution that enables the above aspects, does not exist.

5.0 EXAMPLE INTENT-BASED FACTORIZATION AND COMPUTATIONAL SIMULATION FLOW

Figure 3:
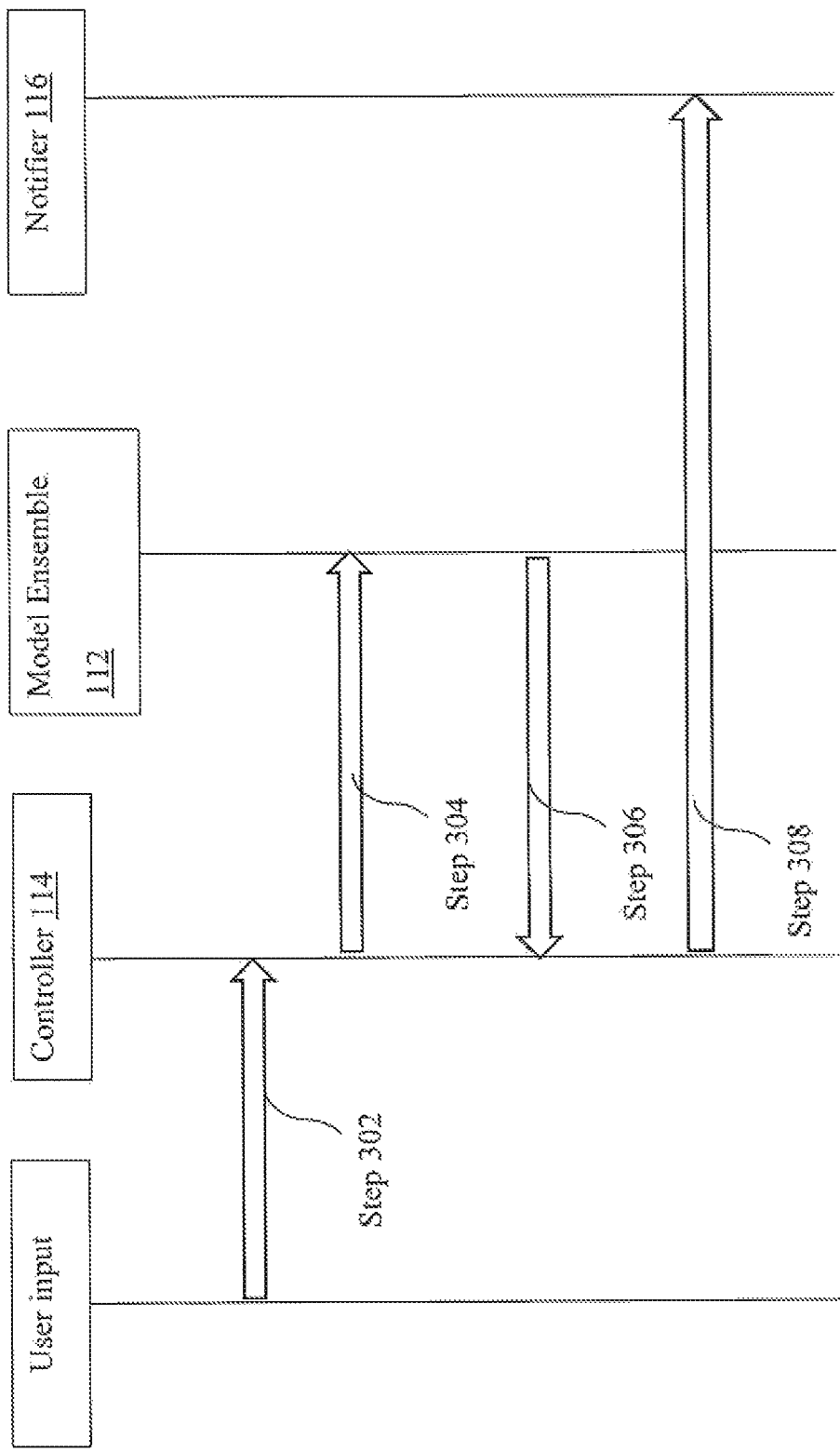
FIG. 3 illustrates an example sequential flow diagram for intent-based factorization and computational simulation, in accordance with the embodiments presented herein.

FIG. 3 illustrates an example flow of simulating a scenario in a computing environment in accordance with an embodiment of the present disclosure. FIG. 3 will be explained in conjunction with the descriptions of FIG. 1, FIG. 2A, and FIG. 2B.

Specifically, FIG. 3 illustrates a sequential flow diagram for intent-based factorization and computational simulation, in accordance with the embodiments presented herein.

At step 302, the controller 114 forming a part of the server computer 106 may receive a user input from a user in accordance with step 202. For instance, a user may provide the user input in a text, an image, a video, or an audio format. The user input may reach the controller 114 via the network 102 or locally.

At step 304, the controller 114 may determine a user intent of the user from the user input as provided for performance of a task which may be a construction project. The task may be identified through state-of-the-art natural language processing techniques, image processing techniques, audio processing techniques, etc., based on the type of user input. In an example, in case of NL-based user input, the input may be subjected to NLP techniques comprising tokenization, normalization, past of speech generation, name-entity identification, word embedding, etc. The user intent may be a personalized user intent as determined using probabilistic modeling techniques. Thereafter, the intent as determined may be computed as a feature set or feature vector for processing by a machine learning model in accordance with step 204 and communicated to model ensemble 112.

In step 306, the model ensemble 112 defining an ensemble learning may process one or more data feeds received from the data feed database 132 based on the user intent determined by the controller 114 in accordance with step 206. Thereafter, the model ensemble 112 communicates the result (e.g., intermediary data sets) back to the controller 114.

In step 308, the controller 114 selects at least one plan of action for executing at least one task based on processing the data feed (at step 306) and the user intent. Further, the controller 114 executes one or more selected plan of actions in the virtual environment based on the processed data feeds (e.g., intermediary data sets). The notifier 116 facilitates such operation by simulating, in a user interface (e.g., a graphical user interface), the plan of action for performance of the intended task as either virtual reality or augmented reality. The present step 308 corresponds to the step 208 of FIG. 2A.

6.0 OTHER ASPECTS OF DISCLOSURE

In an embodiment, one or more computer-readable storage media may be utilized in implementing embodiments consistent with the present disclosure. A computer-readable storage medium refers to any type of physical memory on which information or data readable by a processor may be stored. Thus, a computer-readable storage medium may store instructions for execution by one or more processors, including instructions for causing the processor(s) to perform steps or stages consistent with the embodiments described herein. The term "computer-readable medium" should be understood to include tangible items and exclude carrier waves and transient signals, i.e., be non-transitory. Examples include RAM, read-only memory (ROM), volatile memory, nonvolatile memory, hard drives, CD ROMs, DVDs, flash drives, disks, and any other known physical storage media.

The terms "comprising," "including," and "having," as used in the claims and specification herein, shall be considered as indicating an open group that may include other elements not specified. The terms "a," "an," and the singular forms of words shall be taken to include the plural form of the same words, such that the terms mean that one or more of something is provided. The term "one" or "single" may be used to indicate that one and only one of something is intended. Similarly, other specific integer values, such as "two," may be used when a specific number of things is intended. The terms "preferably," "preferred," "prefer," "optionally," "may," and similar terms are used to indicate that an item, condition, or step being referred to is an optional (not required) feature of the disclosure.

The disclosure has been described with reference to various specific and preferred embodiments and techniques. However, it should be understood that many variations and modifications may be made while remaining within the spirit and scope of the disclosure. It will be apparent to one of ordinary skill in the art that methods, devices, device elements, materials, procedures, and techniques other than those specifically described herein can be applied to the practice of the disclosure as broadly disclosed herein without resort to undue experimentation. All art-known functional equivalents of methods, devices, device elements, materials, procedures, and techniques described herein are intended to be encompassed by this disclosure. Whenever a range is disclosed, all subranges and individual values are intended to be encompassed. This disclosure is not to be limited by the embodiments disclosed, including any shown in the drawings or exemplified in the specification, which are given by way of example and not of limitation. Additionally, it should be understood that the various embodiments of the networks, devices, and/or modules described herein contain optional features that can be individually or together applied to any other embodiment shown or contemplated here to be mixed and matched with the features of such networks, devices, and/or modules.

While the disclosure has been described with respect to a limited number of embodiments, those skilled in the art, having benefit of this disclosure, will appreciate that other embodiments can be devised which do not depart from the scope of the disclosure as disclosed herein.

What is claimed is:

1. A method for simulating a scenario in a computing environment, the method comprising:

training, by a server device, a machine learning model using training data including data relating to previous user inputs received from a user and information about the user;

applying, by the server device, the trained machine learning model to a current user input received from the user to determine a user intent of the user for executing at least one intended task by the user, wherein the user intent is classified as at least one of: a temporal intent, a spatial intent, a fiscal intent, and a societal intent;

generating, by the server device, a feature set based on the user intent;

processing, by the server device and based on the user intent, at least one data feed received from a database to select at least one plan of action for executing the at least one intended task, wherein the processing the at least one data feed comprises processing, based on the user intent, one or more data feeds by a model ensemble implementing an ensemble learning for the one or more data feeds; and simulating, by the server device and in a graphical user interface, the at least one plan of action as virtual or augmented reality based on the feature set to enable at least one of responding an additionally received input from the user and performing the at least one intended task according to the user intent.

2. The method of claim 1, wherein the current user input is received from the user as at least one of: a text, an image, a video, and an audio format, and wherein the at least one intended task is determined from the current user input based on subjecting the current user input to at least one of: a natural language processing technique, an audio processing technique, and an image processing technique.

3. The method of claim 1, wherein the user intent corresponds to a plurality of preferences of the user pertaining to execution of the at least one intended task.

4. The method of claim 1, wherein the feature set corresponds to a multi-dimensional design vector comprising at least one of: a position coordinate system, cost, sustainability, safety, facility management, a construction principle, and an industry standard.

5. The method of claim 1, wherein in case of the user intent being the temporal intent to expedite an ongoing construction process in real-world, the processing the at least one data feed comprises:

processing a data feed related to a real-time cost of a plurality of raw material suppliers;

evaluating each of the plurality of raw material suppliers; and selecting relevant suppliers out of the plurality of raw material suppliers based on the evaluation.

6. The method of claim 1, further comprising providing, by the server device, recommendations of a plurality of activities to be implemented according to the user intent for performance of the at least one intended task.

7. The method of claim 1, wherein the simulating further comprises simulating the at least one plan of action for the at least one intended task in accordance with at least one objective related to the at least one intended task, and wherein the at least one objective is determined from the current user input based on a natural language parser and a work tokenizer.

8. The method of claim 7, wherein the simulating the at least one plan of action comprises simulating a plurality of construction requirements of a project as the augmented reality, and wherein the augmented reality comprises an actual image of a site augmented by at least one content item representing the plurality of construction requirements associated with at least one portion of the actual image.

9. A system for simulating a scenario in a computing environment, the system comprising:

a controller of a server device configured to:

train a machine learning model using training data including data relating to previous user inputs received from a user and information about the user;

apply the trained machine learning model to a current user input received from the user to determine a user intent of the user for executing at least one intended task by the user, wherein the user intent is classified as at least one of: a temporal intent, a spatial intent, a fiscal intent, and a societal intent; and generate a feature set based on the user intent;

a model ensemble of the server device configured to process, based on the user intent, at least one data feed received from a database to select at least one plan of action for executing the at least one intended task, wherein the model ensemble for processing the at least one data feed is configured to process, based on the user intent, one or more data feeds by implementing an ensemble learning for the one or more data feeds; and a notifier of the server device configured to simulate, in a graphical user interface, the at least one plan of action as virtual or augmented reality based on the feature set to enable at least one of responding an additionally received input from the user and performing the at least one intended task according to the user intent.

10. The system of claim 9, wherein the current user input is received from the user as at least one of: a text, an image, a video, and an audio format, and wherein the at least one intended task is determined from the current user input based on subjecting the current user input to at least one of: a natural language processing technique, an audio processing technique, and an image processing technique.

11. The system of claim 9, wherein the user intent corresponds to a plurality of preferences of the user pertaining to execution of the at least one intended task.

12. The system of claim 9, wherein the feature set corresponds to a multi-dimensional design vector comprising at least one of: a position coordinate system, cost, sustainability, safety, facility management, a construction principle, and an industry standard.

13. The system of claim 9, wherein the controller is further configured to provide recommendations of a plurality of activities to be implemented according to the user intent for performance of the at least one intended task.

14. The system of claim 9, wherein the notifier is configured to simulate the at least one plan of action for the at least one intended task in accordance with at least one objective related to the at least one intended task, and wherein the at least one objective is determined from the current user input based on a natural language parser and a work tokenizer.

15. The system of claim 14, wherein the notifier configured to simulate the at least one plan of action is configured to simulate a plurality of construction requirements of a project as the augmented reality, and wherein the augmented reality comprises an actual image of a site augmented by at least one content item representing the plurality of construction requirements associated with at least one portion of the actual image.

16. A non-transitory computer-readable storage medium, having stored thereon a computer-executable program which, when executed by at least one processor of a server device, causes the at least one processor to:

train a machine learning model using training data including data relating to previous user inputs received from a user and information about the user;

apply the trained machine learning model to a current user input received from the user to determine a user intent of the user for executing at least one intended task by the user, wherein the user intent is classified as at least one of: a temporal intent, a spatial intent, a fiscal intent, and a societal intent;

generate a feature set based on the user intent;

process, based on the user intent, at least one data feed received from a database of the user to select at least one plan of action for executing the at least one intended task, wherein the at least one processor for processing the at least one data feed is configured to process, based on the user intent, one or more data feeds by implementing an ensemble learning for the one or more data feeds; and simulate, in a graphical user interface, the at least one plan of action as virtual or augmented reality based on the feature set to enable at least one of responding an additionally received input from the user and perform the at least one intended task according to the user intent.

* * * * *